United States Patent
Yan et al.

(10) Patent No.: US 7,356,787 B2
(45) Date of Patent: Apr. 8, 2008

(54) ALTERNATIVE METHODOLOGY FOR DEFECT SIMULATION AND SYSTEM

(75) Inventors: Jui-Jung Yan, Hsin-Chu (TW); Chung-Min Fu, Chungli (TW); Ricky Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 325 days.

(21) Appl. No.: 11/099,834

(22) Filed: Apr. 6, 2005

(65) Prior Publication Data
US 2006/0230371 A1    Oct. 12, 2006

(51) Int. Cl.
*G06F 17/50*    (2006.01)

(52) U.S. Cl. .................... 716/4; 716/5; 716/6; 382/149

(58) Field of Classification Search ............... 716/4–6; 382/149
See application file for complete search history.

(56) References Cited

U.S. PATENT DOCUMENTS

| | | | | |
|---|---|---|---|---|
| 3,751,647 A * | 8/1973 | Maeder et al. | ............. | 713/401 |
| 4,763,289 A * | 8/1988 | Barzilai et al. | ............. | 703/2 |
| 5,046,109 A * | 9/1991 | Fujimori et al. | ............. | 382/144 |
| 5,581,742 A * | 12/1996 | Lin et al. | ............. | 716/4 |
| 5,586,058 A * | 12/1996 | Aloni et al. | ............. | 702/35 |
| 5,663,569 A * | 9/1997 | Hayano | ............. | 250/559.45 |
| 5,808,735 A * | 9/1998 | Lee et al. | ............. | 356/237.2 |
| 5,886,909 A * | 3/1999 | Milor et al. | ............. | 716/4 |
| 6,484,306 B1 * | 11/2002 | Bokor et al. | ............. | 716/21 |
| 6,526,547 B2 * | 2/2003 | Breiner et al. | ............. | 716/4 |
| 6,583,870 B2 * | 6/2003 | Noda | ............. | 356/237.5 |
| 6,738,954 B1 * | 5/2004 | Allen et al. | ............. | 716/4 |
| 6,927,003 B2 * | 8/2005 | Kim et al. | ............. | 430/5 |
| 2003/0161525 A1 * | 8/2003 | Bruce et al. | ............. | 382/149 |
| 2003/0223631 A1 * | 12/2003 | Ine | ............. | 382/145 |
| 2004/0115541 A1 * | 6/2004 | Yamaguchi et al. | ............. | 430/30 |
| 2005/0110997 A1 * | 5/2005 | Horie | ............. | 356/401 |
| 2005/0146714 A1 * | 7/2005 | Kitamura et al. | ............. | 356/237.2 |

OTHER PUBLICATIONS

Allan G.A, "A comparison of efficient dot throwing and shape shifting extra material critical area estimation", Defect and Fault Tolerance in VLSI Systems, 1998. Proceedings., 1998 IEEE International Symposium on Nov. 2-4, 1998 pp. 44-52.*

* cited by examiner

*Primary Examiner*—Thuan Do
*Assistant Examiner*—Naum Levin
(74) *Attorney, Agent, or Firm*—Thomas, Kayden, Horstemeyer & Risley

(57) ABSTRACT

A system for defect simulation is provided. A defect layout generator generates a defect layout comprising a given number of spot defects of a given size. A processor first compares the defect layout and a provided circuit layout comprising a plurality of conductive regions. The processor further determines whether the spot defects are located on the conductive regions, and determines whether short-circuits and/or open circuits are caused by the spot defects in the conductive regions.

15 Claims, 5 Drawing Sheets

ALTERNATIVE METHODOLOGY FOR DEFECT SIMULATION AND SYSTEM

BACKGROUND

The invention relates to the layout design and manufacture process of integrated circuits, and more particularly to a simulation methodology of defects interaction with layout design.

Defects may be randomly introduced during IC fabrication process. Some of these defects may cause electrical circuitry failures (open or short faults in general), and similar electrical failures are collectively referred to as certain failure mechanisms. For example, spot defects are caused by particles such as dust and other contaminants in materials and equipment. Open or short failures are considered from two types of mechanisms: "extra material" defects causing shorts between different conductive regions; and "missing material" defects causing open circuits. These defects may be randomly occurring particles of foreign matters, of varying sizes, during the manufacturing process. These defects can fatally cause an integrated circuit failure.

Conventionally, susceptibility of an integrated circuit to defects is estimated using complicated numerical methods, such as a computer-aided mathematical analysis of the integrated circuit mask layout. Typically, such an analysis requires complicated numerical methods and large amounts of computing and resources.

For example, the determination of the susceptibility of an integrated circuit to defects may be obtained by a computer analysis of the integrated circuit mask layout. It is common for such an analysis to require lots of computer time and a large amount of computer memory. A substantial cost must be incurred to estimate these properties and other properties of an integrated circuit.

A method commonly used to reduce the time to extract properties is to exploit the hierarchy of the integrated circuit design. In its simplest form the interactions between sub-cells, i.e., discrete areas of the design, are ignored. The technique consists of the analysis of each sub-cell within the design to estimate the property of the sub-cell. This property is then multiplied by the numbers of repeats of the sub-cell within the chip design. The technique is limited by the nature of the design hierarchy. Integrated circuits that are largely made up of multiple copies of a single or a few cells can be analyzed.

The simplified approach of hierarchical extraction of whole chip ignores interactions between cells. This might always lead to certain degree of inaccuracy. The level of inaccuracy is not easily predicted so that the results are less confident. In more complex embodiments interactions between cells are included. This ensures that the results are accurate, but at a cost. The implementation is considerable more difficult. The analysis takes longer since the interaction region, which can be large, must also be processed.

SUMMARY

An alternative methodology of defect simulation and systems are provided. In embodiments of a defect simulation system comprising a defect layout generator and processor, wherein the defect layout generator generates defect layouts with the same layout database format. The processor first compares the defect layouts and a provided circuit layout comprising a plurality of electrical conducting regions. The processor further judges whether the conductive regions are impacted by the spot defects, and determines whether circuitry short and/or open failures are caused by the spot defects in the conductive regions.

Also disclosed are methods of defect simulation. In an embodiment of such a method, a defect layout database comprising a given numbers of spot defects and given sizes is provided. A circuit layout to be analyzed is provided, wherein the circuit layout comprises a plurality of electrical conducting regions. The defect layout and the circuit layout are then processed to judge whether the conductive regions are impacted by the spot defects.

Various methods may take the different forms of program coding embodied in a tangible media or tool. When the program coding is loaded into and executed by a computing machine, the machine becomes an apparatus for practicing the invention.

DESCRIPTION OF THE DRAWINGS

The invention can be more fully understood by reading the subsequent detailed description and examples with references and the accompanying drawings, wherein.

DETAILED DESCRIPTION

In the following detailed description, reference is made to the accompanying drawings which form a part hereof, and in which is shown by way of illustration of specific embodiments. These embodiments are described in sufficient details to enable those skilled in the art to practice the disclosure, and it is to be understood that other embodiments may be utilized and structural, logical and electrical changes may be made without departing from the spirit and scope of the disclosure. The following detailed description is, therefore, not to be taken in a limiting sense. The leading digit(s) of reference numbers appearing in the Figures corresponds to the Figure number, with the exception that the same reference number is used throughout to refer to an identical component, which appears in multiple Figures.

Figure 1:
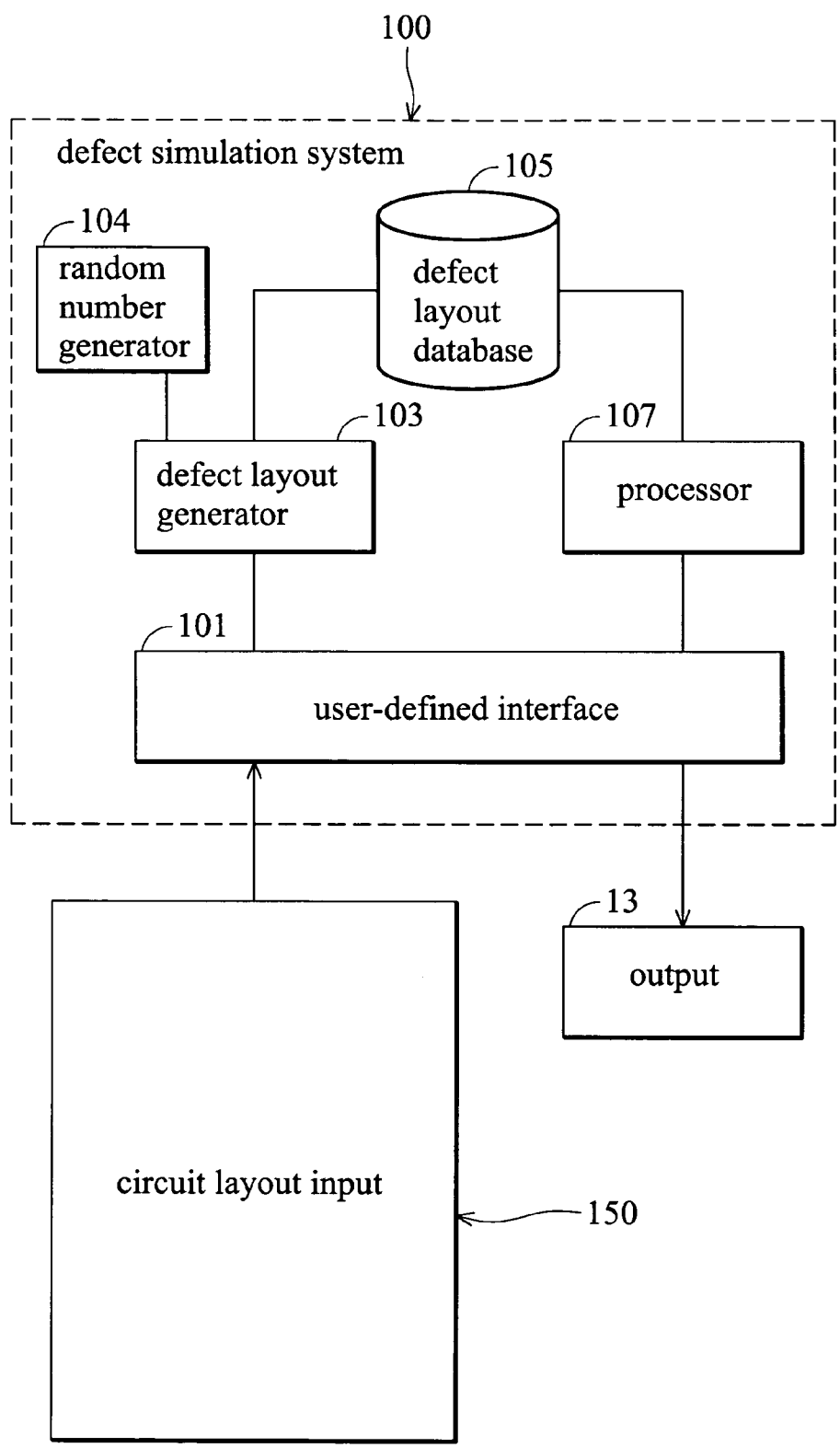
FIG. 1 is a schematic diagram showing an embodiment of a defect simulation system implemented with a circuit design system.

FIG. 1 is a schematic diagram showing an embodiment of a defect simulation system 100 implemented with a circuit layout source 150. As shown in FIG. 1, defect simulation system 100 comprises an interface 101, defect layout generator 103, defect layout database 105, and a processor 107. The circuit layout source 150 provides a circuit layout to defect simulation system 100. The defect simulation system 100 is connected to circuit layout source 150 via the interface 101. The defect simulation system 100 provides output 13 via the interface 101. The defect layout generator 103 receives a plurality of random numbers from a random number generator 104, and determines the positions of a plurality of spot defects according to the received random numbers. The defect layout generator 103 then generates a defect layout comprising a given number of spot defects of a given size arranged according to the positions determined by the random numbers. The defect layout generated by the defect layout generator 103 is stored in the defect layout database 105, and is analyzed by the processor 107. The processor 107 receives a circuit layout input according to a user instruction, and compares the received circuit layout and the defect layout. The processor 107 determines whether the position of the spot defects and the conductive regions overlap and/or comes into contact, and determines whether short-circuit and/or open circuits are caused by the spot defect in the conductive region.

Figure 2:
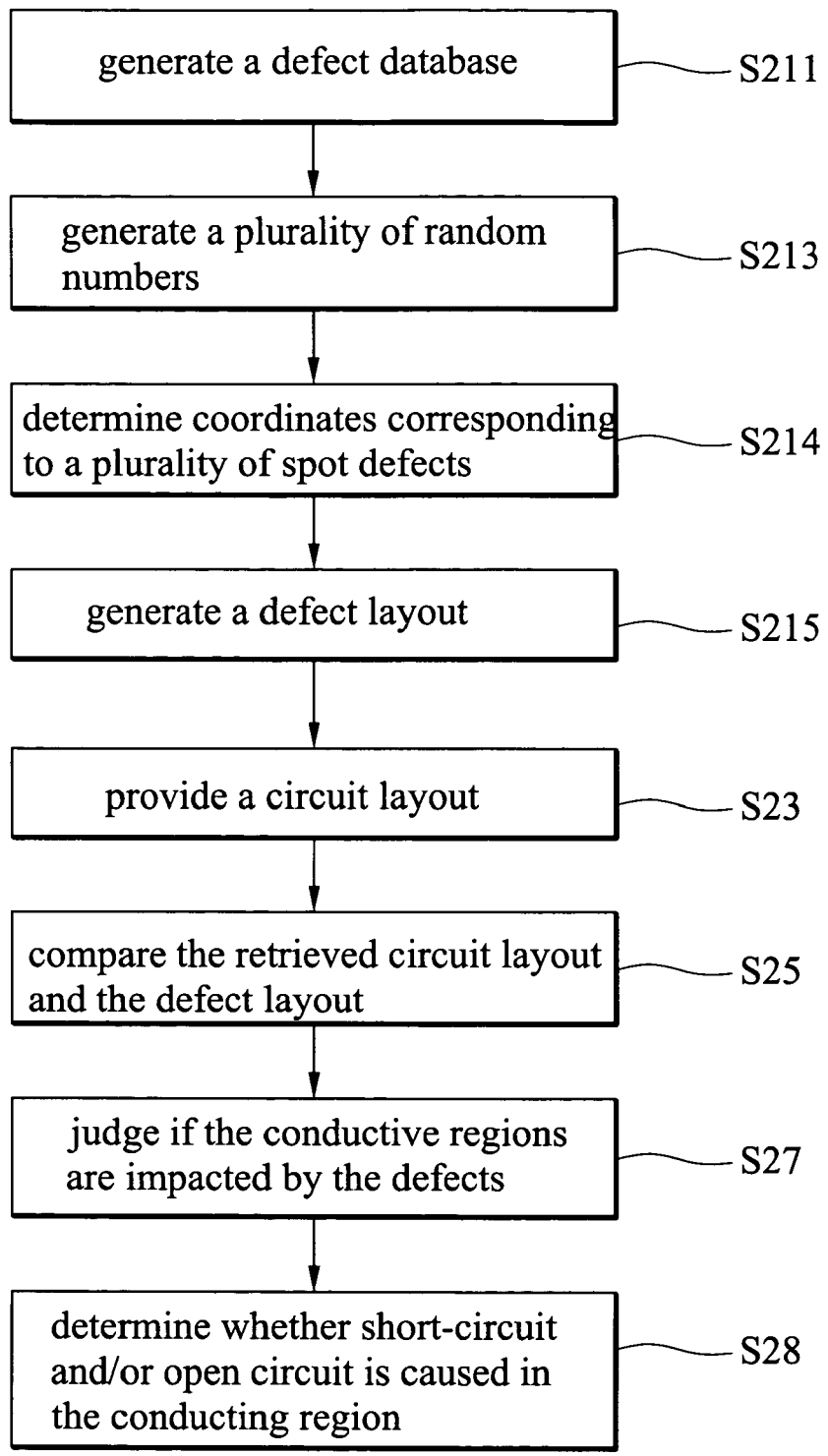
FIG. 2 is a flowchart of an embodiment of a method of defect simulation.
Figure 3A:
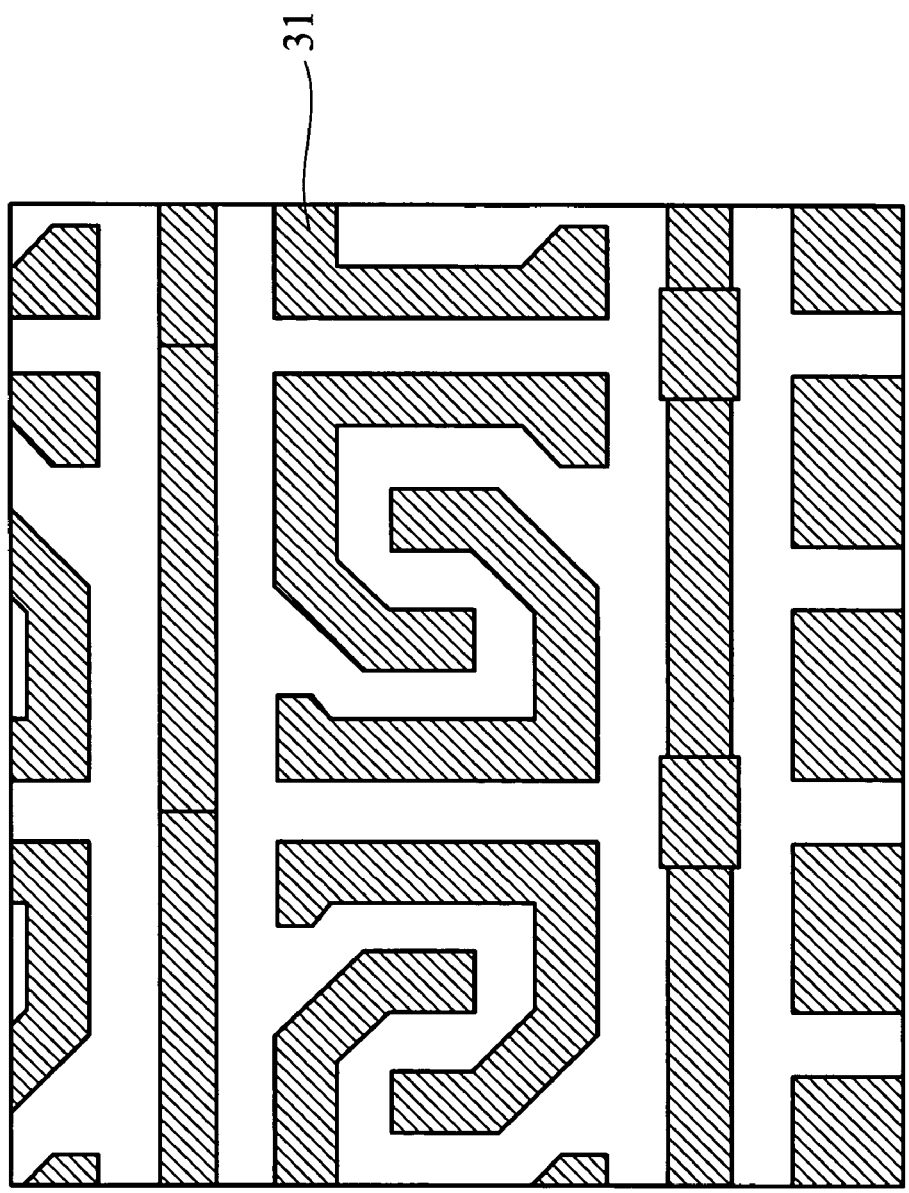
FIGS. 3A~3C illustrate comparison of circuit and defect layouts during the defect simulation.
Figure 3B:
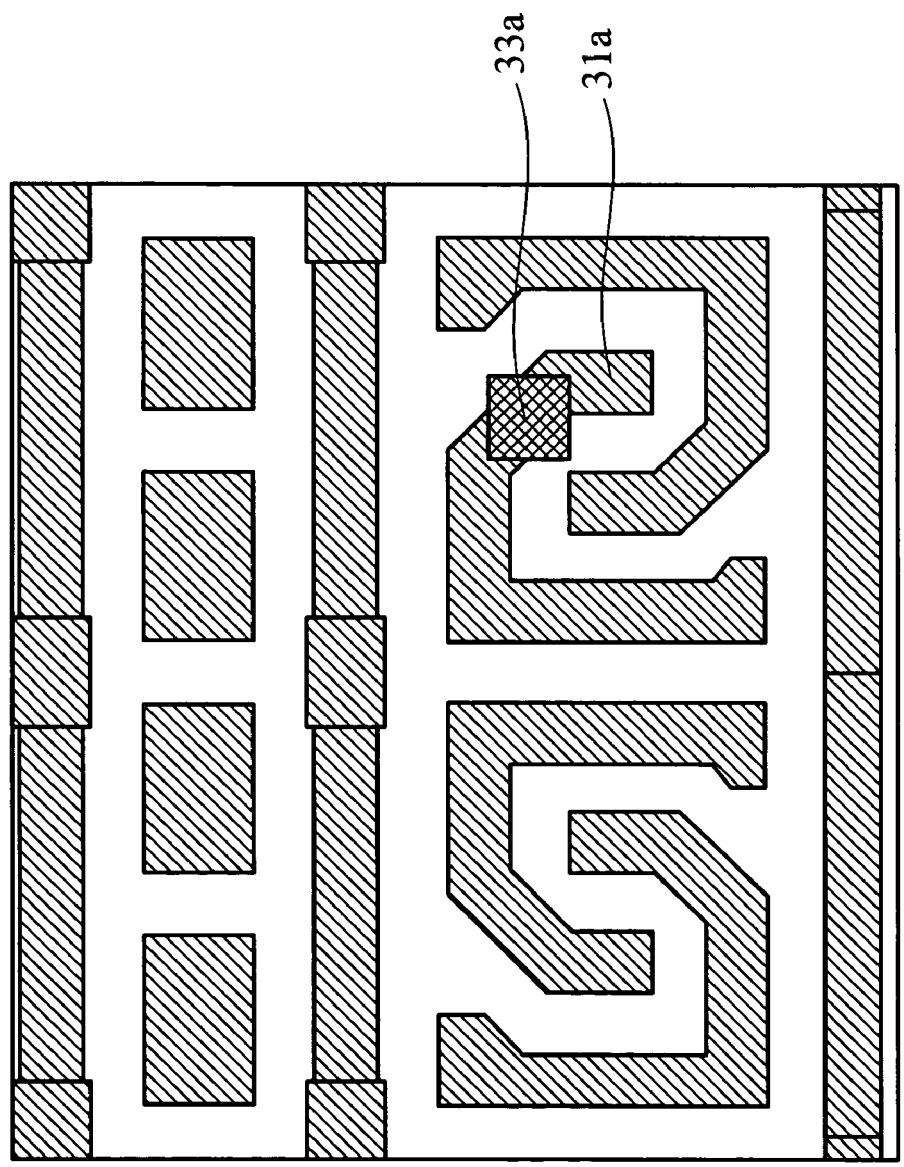
Figure 3C:
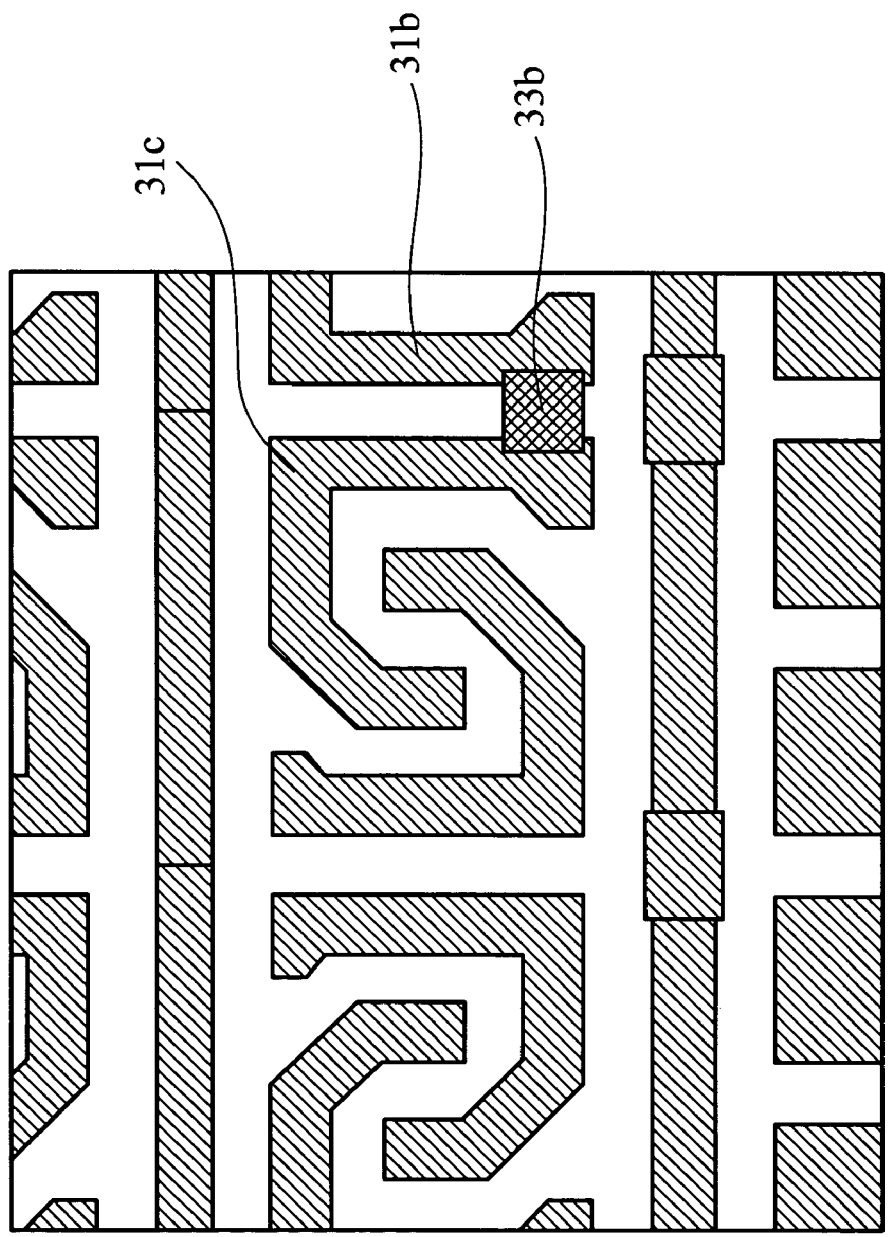

The processing algorithm implemented in defect simulation system 100 is detailed in the flowchart of FIG. 2. A defect database is generated in step S21. In step S211, data specifying the number and size of defects is received. In step S213, a plurality of random numbers are generated. The random numbers may be integers generated by a pseudo-random number generator according to mathematical formula. The number of the random numbers is determined according to given number and size of defects. In step S214, coordinates corresponding to a plurality of spot defects are determined according to the random numbers generated in step S213. A defect layout comprising the spot defects is then generated according to the coordinates based on preset coordinate axis and coordinate center. In step S215, a defect layout comprising spot defects of the given size and number is generated, wherein the spot defects are arranged according to the determined positions. In step S23, a circuit layout is provided, which may be retrieved from a circuit layout database or provided by a user. The circuit layout comprises a plurality of conductive regions 31, as shown in FIG. 3A. In step S25, the retrieved circuit layout and the defect layout are compared. In step S27, it is judged whether the conductive regions are impacted by the spot defects. For example, simple Boolean operations are sufficient, instead of conventional complicated numerical methods. In step S28, it is determined whether short-circuits and/or open circuits are caused by the spot defects in the conductive region. Referring to FIG. 3B, the conductive region 31a is intercepted by spot defect 33a. This interception induces an open circuit in the conductive region 31a. Referring to FIG. 3C, the conductive regions 31b and 31c are bridged by spot defect 33b. Thus short-circuit is caused by the bridged conductive regions.

In case necessary, instead of using an experimentally optimum defect layout, the above process may be repeated several times for different defect layouts. The results thereof may be taken into consideration in combination to make an engineering decision more accurate.

The described system and method may be applied to extra material of a given size and other defect types, such as missing material, pinhole, inter-level dielectric defects and defective contacts and vias.

Results obtained from the described defect simulation may be further used for various applications.

For example, the defect simulation may be used for estimating sensitivity or susceptibility of a circuit layout to the defects during the manufacturing process. The susceptibility of the integrated circuit to the defects can be used to estimate the manufacturing yield of the devices, or for further engineering study. It could also be used to estimate the cost or the volume required for the production of a given number of good circuit dies in planning phase.

The technique of characterizing layout may be extended to the characterization of particular design environments used for automated integrated circuit design, in particular, to compare the manufacturability and other characteristics of different design environment.

The present invention is capable of analyzing large commercial integrated circuits (1,000,000 transistors) in a reasonable time with standard computer resources. Additionally, the practical applications of the invention are not limited by the design hierarchy, the size of the device or the design environment used to produce the design. The preferred embodiment of the present invention can be used even by those of ordinary skill. The significant increase in execution speed and lower memory requirements permitted by the present invention make possible the practical application of more rigorous techniques. Such techniques are not generally considered practical because of the time and/or computer memory requirements.

Various embodiments, or certain aspects or portions thereof, may take the different forms of program coding (i.e., instructions) embodied in tangible media or tools, when the program code is loaded into and executed by a computing machine, such as a computer, the machine becomes an apparatus for practicing the invention. Some embodiments may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing embodiments of the invention. When implemented on a general-purpose processor, the program coding combines with the processor to provide a unique apparatus that operates analogously to specific logic circuits.

While the invention has been described by way of example and in terms of preferred embodiment, it is to be understood that the invention is not limited thereto. Those who are skilled in this technology can still make various alterations and modifications without departing from the scopes and spirits of this invention. Therefore, the scope of the present invention shall be defined and protected by the following claims and their equivalents.

What is claimed is:

1. A method for defect simulation, comprising:
providing a defect layout comprising a given number of spot defects of one or more given sizes, wherein locations of the spot defects are determined randomly or by a given rule, the given number of the spot defects and the one or more given sizes of the spot defects are user-defined;
providing a circuit layout comprising a plurality of conductive regions;
comparing the defect layout and the circuit layout; and
determining whether at least one spot defect is located on the conductive regions.

2. The method of claim 1, further comprising: providing a defect layout database, wherein said defect layout is selected from said defect layout database.

3. The method of claim 2, wherein the circuit layout comes from a design layout database, and wherein said defect layout database and said design layout database have the same format.

4. The method of claim 1, further comprising repeating the steps with a different defect layout.

5. The method of claim 1, further determining whether at least one spot defect causes a short-circuit between conductive regions.

6. The method of claim 1, further determining whether at least one spot defect causes an open-circuit in the conductive region.

7. The method of claim 1, further estimating susceptibility of the circuit layout to the defects of the defect layout.

8. The method of claim 1, further estimating a manufacturing yield of the circuit layout.

9. A system for defect simulation, comprising:
a defect layout generator generating a defect layout comprising a given number of spot defects of one or more given sizes, wherein the defect layout generator determines locations of the spot defects randomly or by a given rule, the given number of the spot defects is user-defined, and the one or more sizes of the spot defects are user-defined: and a processor comparing the defect layout and a provided circuit layout comprising a plurality of conductive regions, and determining whether at least one spot defect locates on the conductive region.

10. The system of claim 9, further comprising a defect layout database including a plurality of defect layouts.

11. The system of claim 10, wherein the circuit layout is provided from a design layout database, and wherein said defect layout database and said design layout database have the same format.

12. The system of claim 9, wherein the processor further determines whether at least one spot defect causes a short-circuit between conductive regions.

13. The system of claim 9, wherein the processor further determines whether at least one spot defect causes an open-circuit in the conductive region.

14. The system of claim 9, wherein the processor further estimates susceptibility of the circuit layout to the defects of the defect layout.

15. The system of claim 9, wherein the processor further estimates a manufacturing yield of the circuit layout.

* * * * *